(12) United States Patent
Wu et al.

(10) Patent No.: US 11,739,179 B2
(45) Date of Patent: Aug. 29, 2023

(54) DISULFIDE-CONTAINING MONOMER, ITS REDUCED FORM, AND ITS DERIVATE, METHOD TO SYNTHESIZE THE SAME, AND POLYMER CONTAINING THE SAME

(71) Applicant: AMBILIGHT INC., Milpitas, CA (US)

(72) Inventors: Wenting Wu, Lafayette, IN (US); Jianguo Mei, West Lafayette, IN (US)

(73) Assignee: AMBILIGHT INC., Milpitas, CA (US)

( * ) Notice: Subject to any disclaimer, the term of this patent is extended or adjusted under 35 U.S.C. 154(b) by 0 days.

(21) Appl. No.: 17/488,898

(22) Filed: Sep. 29, 2021

(65) Prior Publication Data

US 2022/0112333 A1  Apr. 14, 2022

Related U.S. Application Data

(60) Provisional application No. 63/091,835, filed on Oct. 14, 2020.

(51) Int. Cl.
*C08G 61/12* (2006.01)
*C08K 3/06* (2006.01)

(52) U.S. Cl.
CPC .............. *C08G 61/126* (2013.01); *C08K 3/06* (2013.01); *C08G 2261/3247* (2013.01); *C08G 2261/54* (2013.01)

(58) Field of Classification Search
CPC .......... C08G 61/126; C08G 2261/3247; C08G 2261/54; C08K 3/06
USPC ................ 528/377, 380, 373, 30; 549/50, 4; 536/18.1
See application file for complete search history.

(56) References Cited

PUBLICATIONS

Abdulla et al., Polymers 2019, 11, 815-834.*

* cited by examiner

*Primary Examiner* — Shane Fang

(57) ABSTRACT

The present disclosure presents a disulfide containing monomer, its reduced form, its derivative, the synthesis method of this disulfide containing monomer, and the polymer containing the monomers disclosed thereof

7 Claims, 8 Drawing Sheets

DISULFIDE-CONTAINING MONOMER, ITS REDUCED FORM, AND ITS DERIVATE, METHOD TO SYNTHESIZE THE SAME, AND POLYMER CONTAINING THE SAME

REFERENCE TO RELATED APPLICATIONS

The present application claims priority to U.S. Provisional Application No. 63/091,835 filed on Oct. 14, 2020. The entire content of the above-referenced application is incorporated herein by reference.

TECHNICAL FIELD

The present disclosure is related to a disulfide-containing monomer, its reduced forms, its derivatives, a method to synthesize the monomer, and a polymer containing the disulfide-containing monomer, its reduced form, or its derivate.

BACKGROUND

The capability to create functionalized polymers is essential to adjust polymers' properties (such as reactivity, hydrophobicity, rigidity, thermal stability, solvent resistance, etc.), improve interactions with solid substrates, and tailor biological responses. It is also desired to create functional and soluble polymers that could be processed into any useful forms, such as fibers or films, for various applications, especially by manufacturing friendly processes. However, designing and incorporating a buildable module to create such functionalized polymers is still to be explored.

SUMMARY

The present disclosure presents a disulfide-containing electrochromic monomer of formula 1

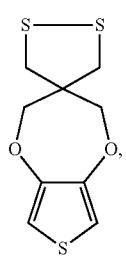

Formula 1 or a reduced form (formula 2) of the disulfide-containing monomer of formula 1,

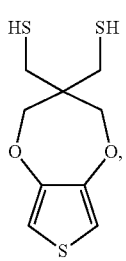

Formula 2 or a derivative (formula 3) of the disulfide-containing monomer of formula 1 or 2,

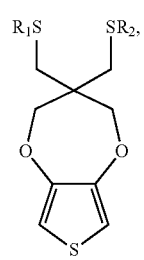

Formula 3 wherein each of $R_1$ and $R_2$ is a hydrocarbyl moiety with or without one or more functional groups. The monomer of formula 2 and the monomer of formula 3 are produced directly or indirectly from the monomer with formula 1.

The present disclosure also presents a polymer prepared by incorporating at least one monomer of the formula 1, the formula 2, or the formula 3 to a monomer or a polymer. In some embodiments, the at least one monomer of the formula 1, the formula 2, or the formula 3 is incorporated to another monomer or a polymer under a polymerization reaction, a crosslinking reaction, a functionalization reaction, or a modification reaction of the polymer.

In another aspect, the present disclosure also presents a method to form the disulfide-containing monomer of formula 1. The method comprises contacting a monomer of formula 4 with sulfur in a form of allotrope and a vulcanized reagent in the presence of a polar solvent,

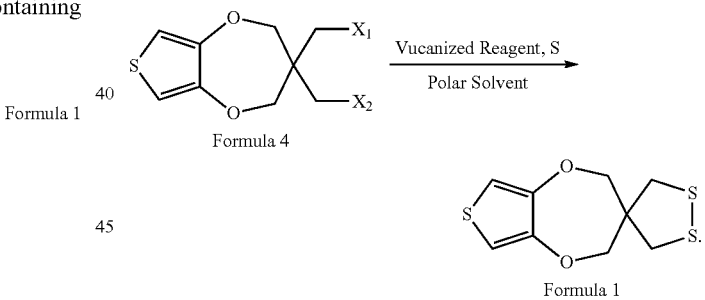

Formula 4

Formula 1

Each of $X_1$ and $X_2$ can be a functional group that can form nucleophilic substitutional reactions at their position. The vulcanized reagent is a sulfur-containing compound that can participate in the nucleophilic substitution reaction. S is sulfur in any form of allotrope. The Polar solvent comprises one or more of chloroform, dichloromethane, nitromethane, acetonitrile, or toluene. In some embodiments, each of $X_1$ and $X_2$ comprises one of Cl, Br, I, OH, or triflate(OTf). In some embodiments, the vulcanized reagent comprises one of NaHS, KHS, $Na_2S$, $K_2S$, $Na_2S_2O_3$, $H_2S$, or $CS(NH_2)_2$.

In another aspect, the present disclosure also presents a method to form the reduced form of the disulfide-containing monomer of the formula 2. After using the method to form monomer of formula 1, the method includes conducting a reduction of the disulfide-containing monomer of formula 1 with at least one reducing agent to form monomer of the formula 2.

In another aspect, the present disclosure also presents a method to form the derivative of the disulfide-containing monomer of formula 3. After using the method to form monomer of formula 1, the method includes conducting a sulfide/thiol involving reaction with the monomer of the formula 1 or the formula 2 to form monomer of formula 3.

The present disclosure presents an electrochromic device comprising the disclosed polymer.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the invention are utilized, and the accompanying drawings below. For the purpose of illustrating the invention, the drawings show aspects of one or more embodiments of the invention. However, it should be understood that the present invention is not limited to the precise arrangements and instrumentalities shown in the drawings.

DETAILED DESCRIPTION OF EMBODIMENTS

Figure 1:
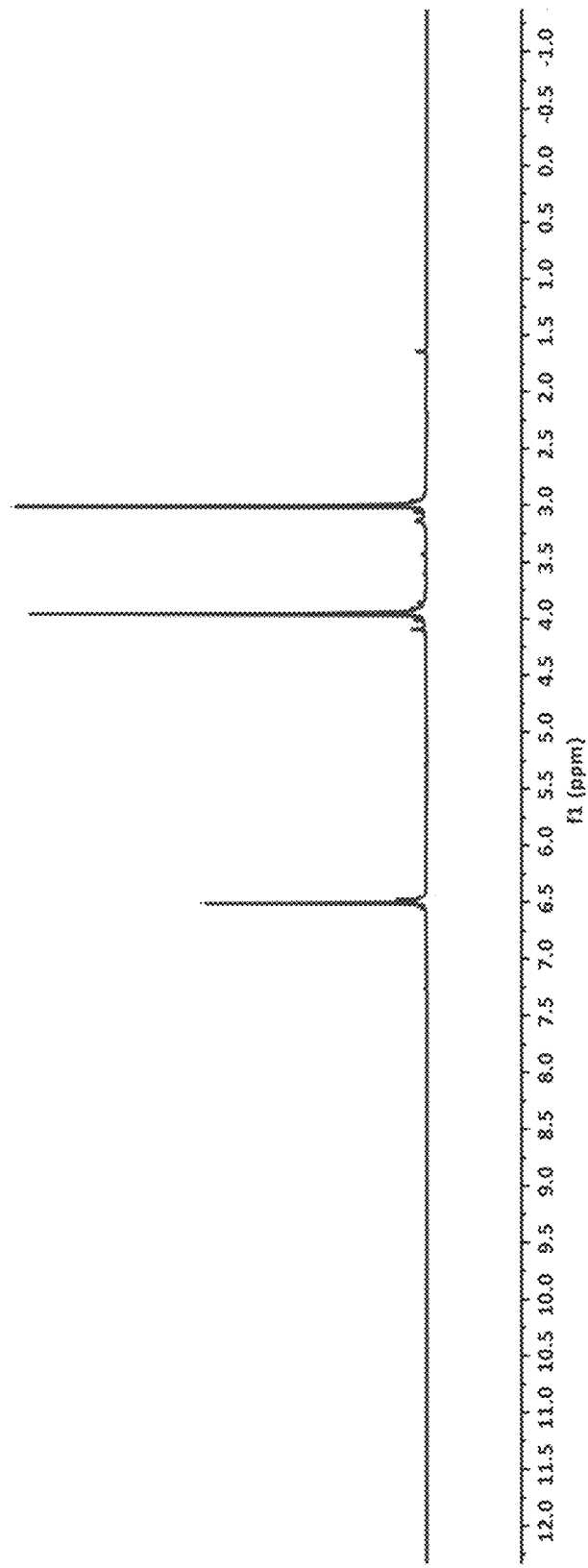
FIG. 1 is Nuclear Magnetic Resonance (NMR) data of the disulfide-containing monomer of the formula 1.

In the following description, certain specific details are set forth in order to provide a thorough understanding of various embodiments of the invention. However, one skilled in the art will understand that the invention may be practiced without these details. Moreover, while various embodiments of the invention are disclosed herein, many adaptations and modifications may be made within the scope of the invention in accordance with the common general knowledge of those skilled in this art. Such modifications include the substitution of known equivalents for any aspect of the invention in order to achieve the same result in substantially the same way.

Unless the context requires otherwise, throughout the present specification and claims, the word "comprise" and variations thereof, such as "comprises" and "comprising" are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it was individually recited herein. Additionally, the singular forms "a" "an", and "the" include plural referents unless the context clearly dictates otherwise.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment, but may be in some instances. Furthermore, the particular features, structures, or characteristics may be combined in any suitable manner in one or more embodiments.

The present invention is related to an electrochemical monomer comprising a disulfide-containing monomer of formula 1,

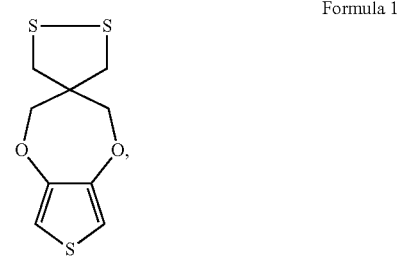 [SMILES: c1scc2c1OCC1(CO2)CSSC1]

Formula 1 or a reduced form of the disulfide-containing monomer of formula 1 as shown as formula 2 below,

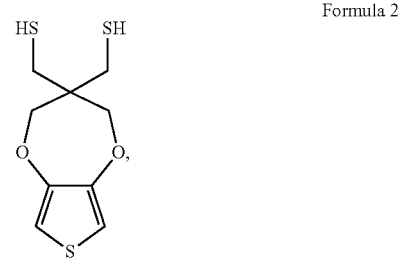 [SMILES: SCC1(CS)COc2cscc2OC1]

Formula 2 or a derivative of the disulfide-containing monomer of formula 1 or 2 as shown below as formula 3,

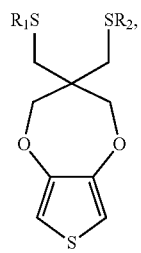

Formula 3 wherein each of $R_1$ and $R_2$ is hydrocarbyl moiety with or without one or more functional groups. Example $R_1$ and $R_2$ may include, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_3$-$C_{30}$ heterocyclylalkyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ $C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl.

The monomer with formula 2 and the monomer with formula 3 are produced directly or indirectly from the monomer with formula 1.

A method to prepare the disclosed disulfide-containing monomer is provided. Scheme 1 shows the general preparation scheme to make the disclosed disulfide-containing monomer of formula 1.

Scheme 1. The general preparation scheme to make the disclosed disulfide-containing monomer.

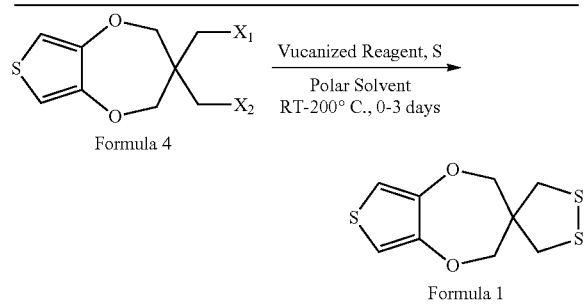

Scheme 1 shows the general preparation scheme to make the disclosed disulfide-containing monomer of formula 1. The disclosed disulfide-containing monomer is formed by contacting a monomer of formula 4 with a vulcanized reagent and sulfur dissolved in a polar solvent at a temperature ranging from room temperature (RT) to 200° C. for up to 3 days. In Scheme 1, $X_1$ and $X_2$ can be functional groups that can participate in nucleophilic substitutional reactions. Example $X_1$ and $X_2$ may include, but are not limited to, Cl, Br, I, OH, or triflate (OTf). The vulcanized reagent is a sulfur-containing compound that can serve as a nucleophile in the nucleophilic substitution, as shown by Scheme 1. Example vulcanized reagents may include, but are not limited to, NaHS, KHS, $Na_2S$, $K_2S$, $Na_2S_2O_3$, $H_2S$, or $CS(NH_2)_2$. S is sulfur in any form of allotrope. Example S may include, but is not limited to, octasulfur ($S_8$). Examples of polar solvents may include, but are not limited to, chloroform, dichloromethane, nitromethane, acetonitrile, or toluene. After the reaction, the desired monomer may be isolated and purified if necessary by standard techniques, such as extraction, washing, drying, precipitation, chromatography, recrystallization, and/or distillation.

In one embodiment, $Na_2S$ is used as the vulcanized reagent, and DMF is used as the polar solvent to synthesize the disclosed monomer of formula 1. $S_8$ (18.0 mg, 0.56 mmol) and $Na_2S$ (21.9 mg, 0.28 mmol) are added to DMF (100 mL) and form a solution of a reaction mixture. The reaction mixture is stirred for 2 h at 80° C. and turns deep blue. After addition of 3,3-bis(bromomethyl)-3,4-dihydro-2H-thieno [3,4-b][1,4]dioxepine (96.0 mg, 0.28 mmol), the mixture is heated at 120° C. overnight. Added to the mixture is ice, and the water layer is extracted with DCM three times. The combined organic phases are washed with brine, dried over $MgSO_4$, and concentrated under reduced pressure. The crude product is purified by column chromatography (DCM/MeOH) to yield the disclosed disulfide-containing monomer (55 mg, 80%) as a white crystal.

FIG. 1 shows the $^1$H NMR spectra of the resulted monomer product. The peak at 6.51 ppm is attributed to the H from the thiophene group, 3.96 ppm peak is attributed to H from the $CH_2$—O, 3.01 ppm peak is attributed to the H from the SS—$CH_2$. The molecular weight calculated for $C_9H_{10}O_2S_3$ [M+H]$^+$ is 245.98, and found to be 246.9918.

The monomer with formula 2 and the monomer with formula 3 are produced directly or indirectly from the monomer with formula 1.

The reduced form of the disulfide-containing monomer with formula 2 can be formed by reducing the disulfide-containing monomer of formula 1 with at least one reducing agent. The reducing agent may include, but is not limited to, tris(2-carboxyethyl)phosphine (TCEP), dithiothreitol (DTT), 2-mercaptoethanol (2-ME), or glutathione (GSH). The reduction may be operated under an appropriate pH for that selected reducing agent. The reduced monomer of formula 2 may also be produced from the monomer of formula 3 by a nucleophilic substitution reaction.

Figure 2:
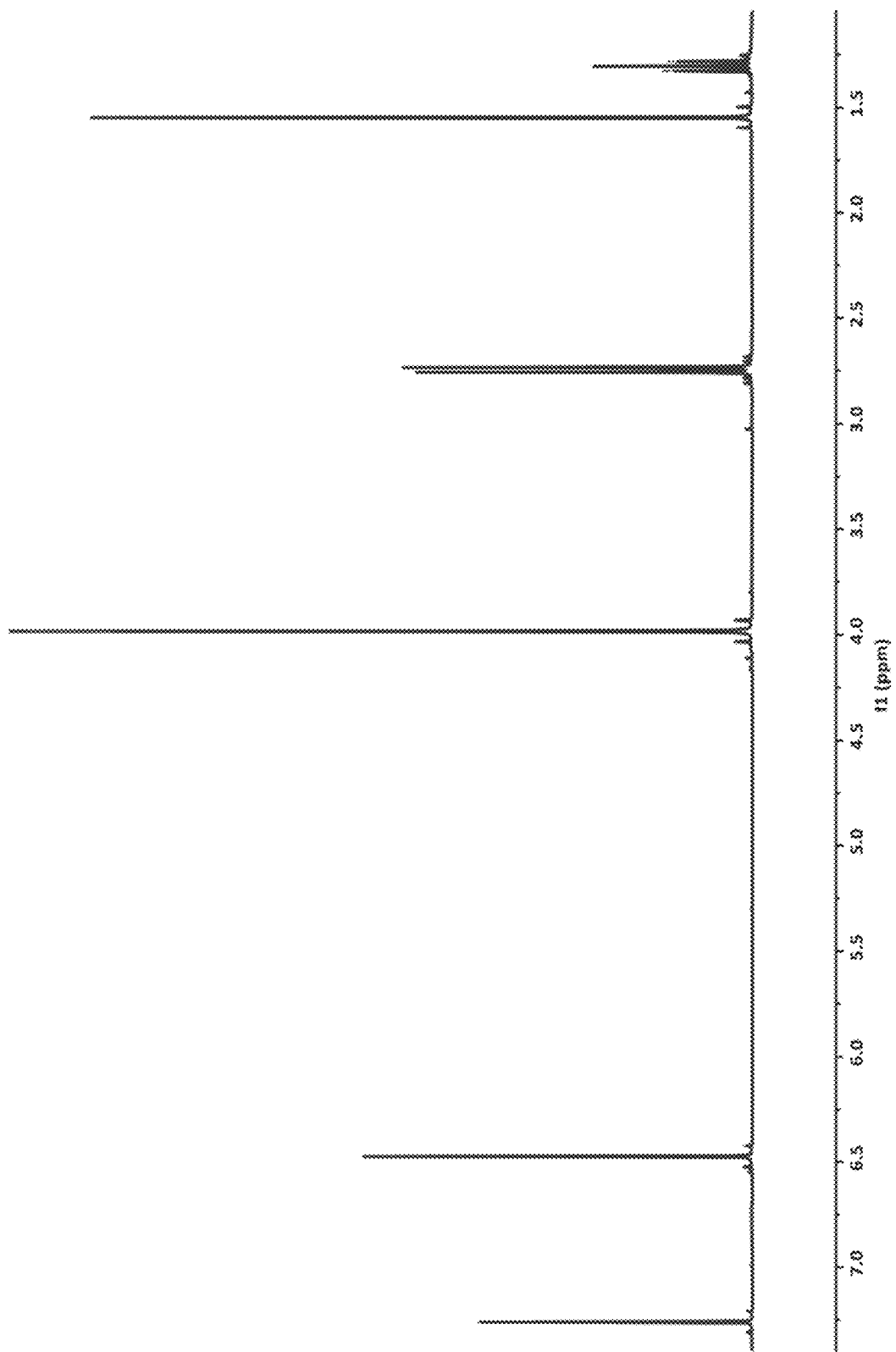
FIG. 2 is NMR data of a disulfide-containing monomer of the formula 2.

In some embodiments, the reduced form of the disulfide-containing monomer with formula 2 is prepared by reducing the monomer of formula 1 by TECP with a molar ratio of 1:1.25 in a 0.1 M phosphate-buffered solution (PH 7). The reaction solution is stirred at room temperature for 2 hours before the addition of 50 μL AcOH. The organic solvent is removed by rotatory evaporation. The organic phase is extracted and filtered to yield the monomer of formula 2 as a colorless oil (yield about 99%). FIG. 2 shows the $^1$H NMR spectra of the resulted monomer product of formula 2. The peak at 6.48 ppm is attributed to the H from the thiophene group, 3.98 ppm peak is attributed to H from the $CH_2$—O, 2.76, and 2.73 ppm peaks are attributed to the H from the S—$CH_2$. 1.33, 1.30, 1.28 ppm peaks are attributed to the H from the thiol group.

The derivative form of the disulfide-containing monomer with formula 3 can be formed by sulfide/thiol involving reactions with the monomer of formula 1 or formula 2. The sulfide/thiol-related reactions to form the derivative form of formula 3 comprises disulfide-thiol exchange, thiol-ene/yne click reactions, thiol-Michael addition reactions, thiol-maleimide reactions, or nucleophilic substitution reactions. For example, by disulfide-thiol exchange reaction, the disulfide-containing monomer of formula 1 can be used to synthesize the derivative monomer of formula 3. By a nucleophilic substitution reaction, the reduced monomer of formula 2 can be used to synthesize the derivative monomer of formula 3.

In some embodiments, an example derivative monomer of formula 5 can be formed by the nucleophilic substitution reaction of the reduced monomer of formula 2 reacted with 2, 2-bromo-2-methylpropane in the presence of a base $K_2CO_3$.

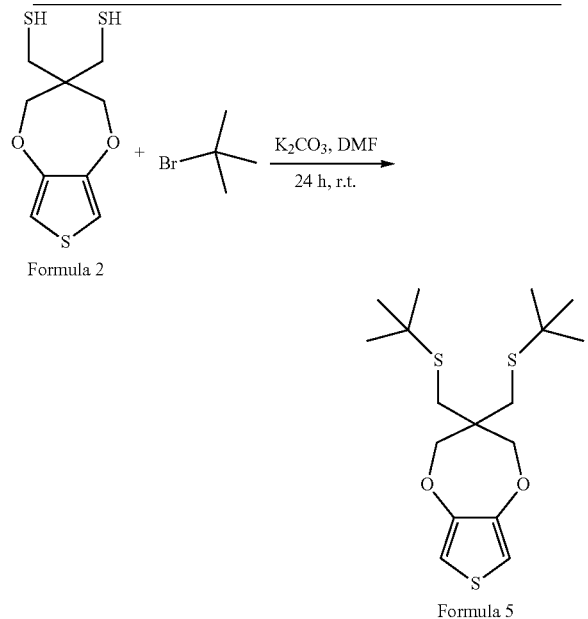

Scheme 2. Example synthesis route for an example derivative form of monomer.

Formula 2

Formula 5

Figure 3:
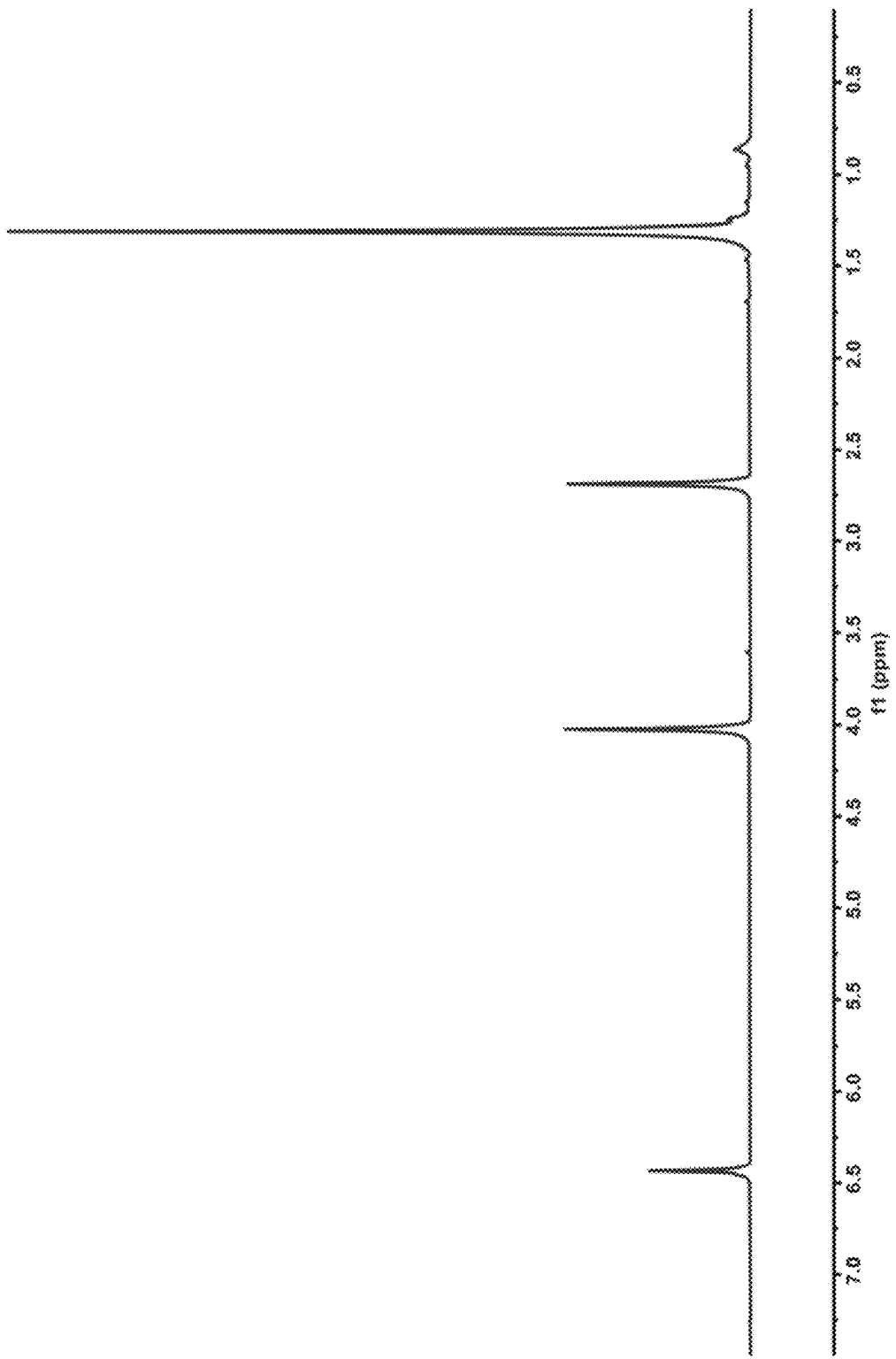
FIG. 3 is NMR data of a disulfide-containing monomer of the formula 3.

The reaction solution is formed by dispersing $K_2CO_3$ in DMF with a molar ratio of 5:1. The reaction solution is sparged with Ar gas to remove water and oxygen. 2-bromo-2-methylpropane and the reduced monomer of formula 2 are added to the reaction solution with a molar ratio of 4:1 (2-bromo-2-methylpropane: reduced monomer of formula 2), the final concentration of the monomer of formula 5 is 0.3 M. The resulting mixture solution is stirred vigorously for 24 hours to yield the desired product. Further extraction and concentration steps are carried out by organic extraction with brine, $MgSO_4$ treatment, and rotatory evaporation, resulting in the desired compound with a high yield of 95%. FIG. 3 shows the $^1H$ NMR spectra of the example monomer of formula 5. The peak at 6.44 ppm is attributed to the H from the thiophene group, 4.03 ppm peak is attributed to the H from the $CH_2$—O, 2.69 ppm peaks are attributed to the H from S—$CH_2$. 1.33, 1.31, 1.30, ppm peaks are attributed to the H from the isobutane group.

The present invention is also related to a polymer prepared by incorporating at least one of the disclosed monomers or crosslinking monomers of at least one of the disclosed monomers. In some embodiments, the disclosed polymer is prepared by polymerization of monomers of at least one of the disclosed monomers. In some embodiments, the disclosed polymer is a polymer incorporating at least one monomer of one of the disclosed monomers for further crosslinking. In some embodiments, the disclosed polymer is a polymer incorporating monomers of at least one of the disclosed monomers for further modification or functionalization. The polymer can be a homopolymer or copolymer. The copolymer can be made by polymerization of at least two of the disclosed monomers or one or more of the disclosed monomers copolymerized with one or more of any other appropriate monomers. For example, the disclosed monomer of formula 1 may be homo-polymerized, or copolymerized with the disclosed monomer of formula 3, or copolymerized with 3,4-ethylenedioxythiophene (EDOT).

In some embodiments, the disclosed polymer is a homopolymer, comprising at least one of the formulas of

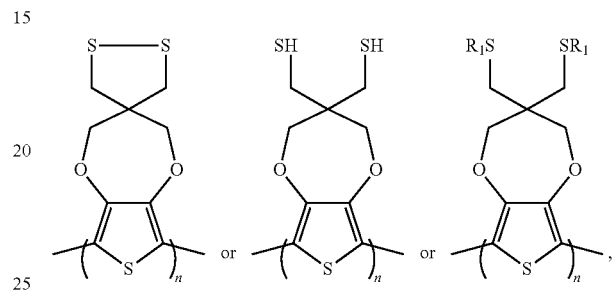

wherein n is an integer greater than 0; each of $R_1$ and $R_2$ is a hydrocarbyl moiety with or without one or more functional groups, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{15}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_3$-$C_{30}$ heterocyclylalkyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl.

In some embodiments, the disclosed polymer is a copolymer, comprising at least one of the formulas of

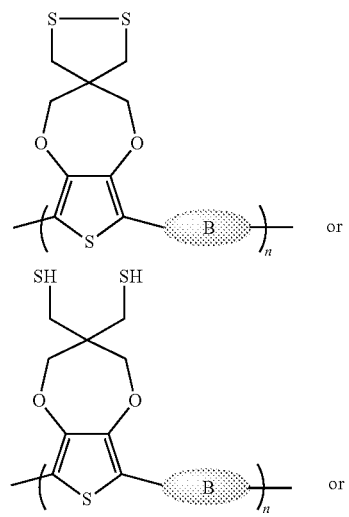

-continued

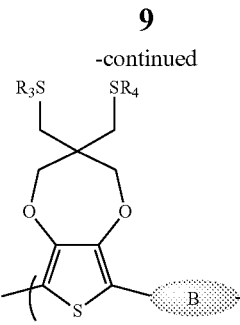

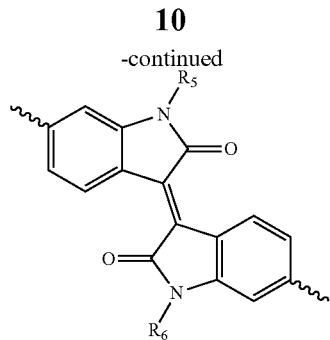

wherein n is an integer greater than 0; each of $R_3$ and $R_4$ independently is a hydrocarbyl moiety with or without one or more functional groups, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_3$-$C_{30}$ cycloalkylalkylaminyl, C5-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_3$-$C_{30}$ heterocyclylalkyloxy, $C_1$-$C_{30}$ heterocyclylalkyloxy, $C_1$-$C_{30}$ heterocyclylaminyl, Cs-Cm heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl, and ⬚ is selected from the group including, but not limited to:

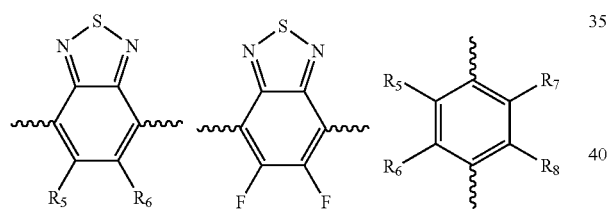

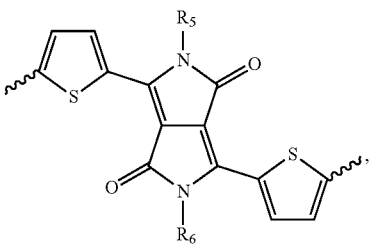

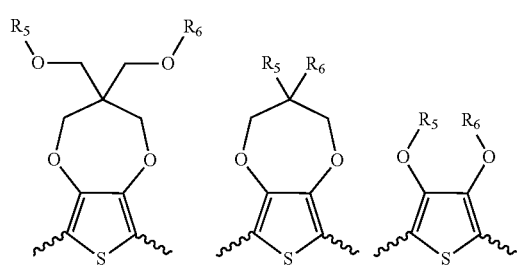

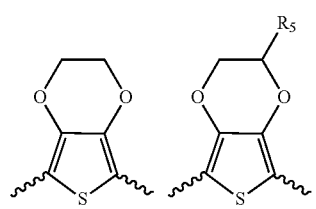

wherein the wave line ～ represent the connecting points of the polymer unit, and each of $R_5$, $R_6$, $R_7$, and $R_8$ is independently selected from a hydrocarbyl moiety with or without one or more functional groups, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ aminylcarbonyl, $C_4$-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_3$-$C_{30}$ heterocyclylalkyloxy, $C_1$-$C_{30}$ heterocyclylalkyloxy, $C_1$-$C_{30}$ heterocyclylaminyl, $C_5$-$C_{30}$ $C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl; and ⬚ is incorporated into the polymer using a compound selected from the group including, but not limited to:

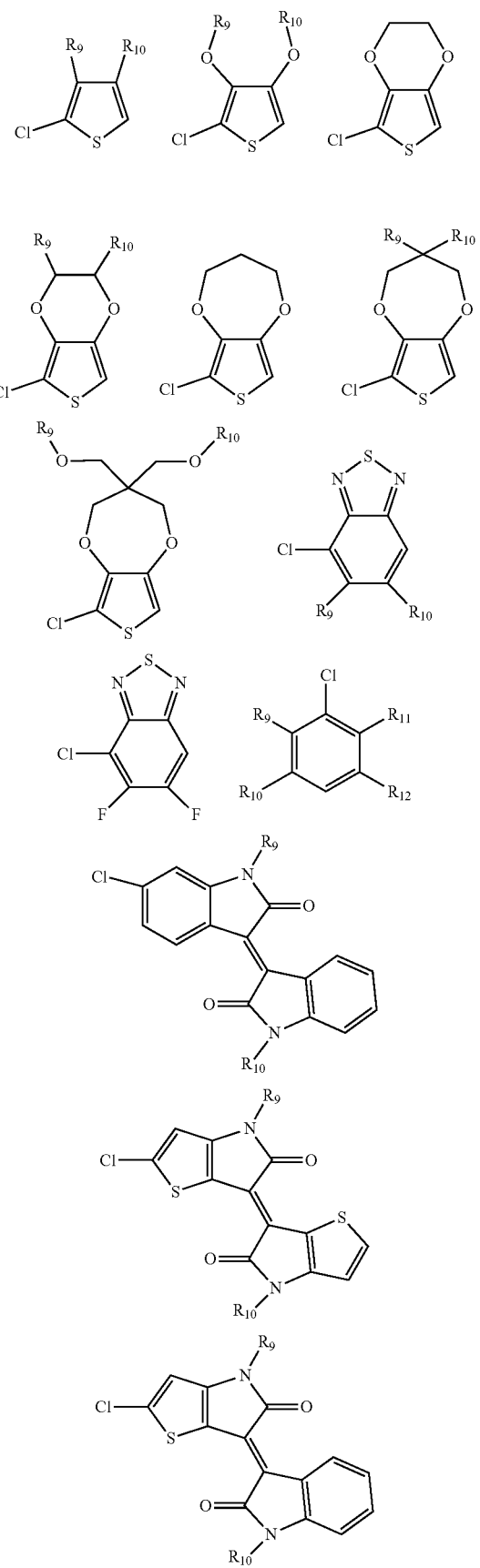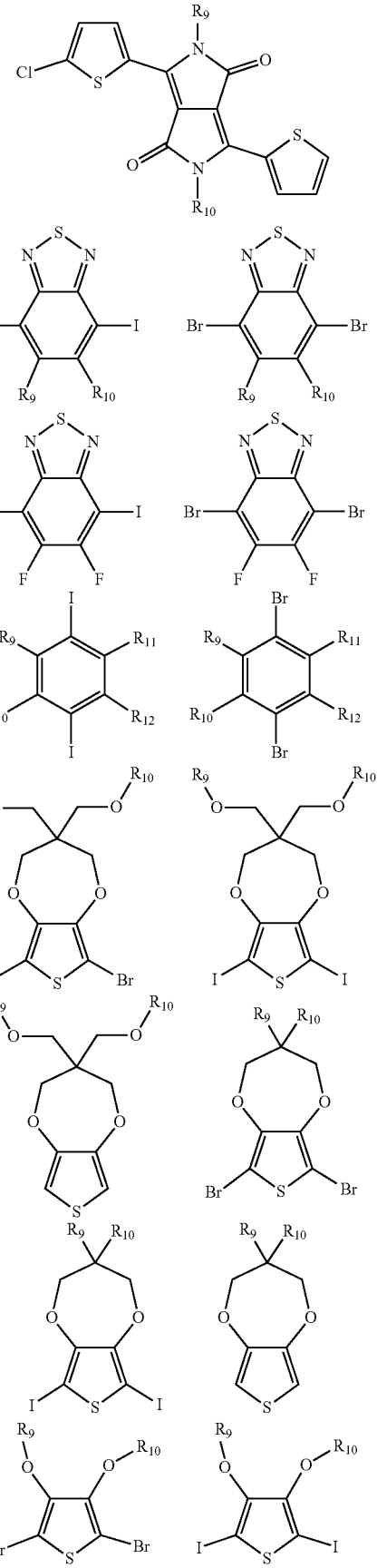

-continued

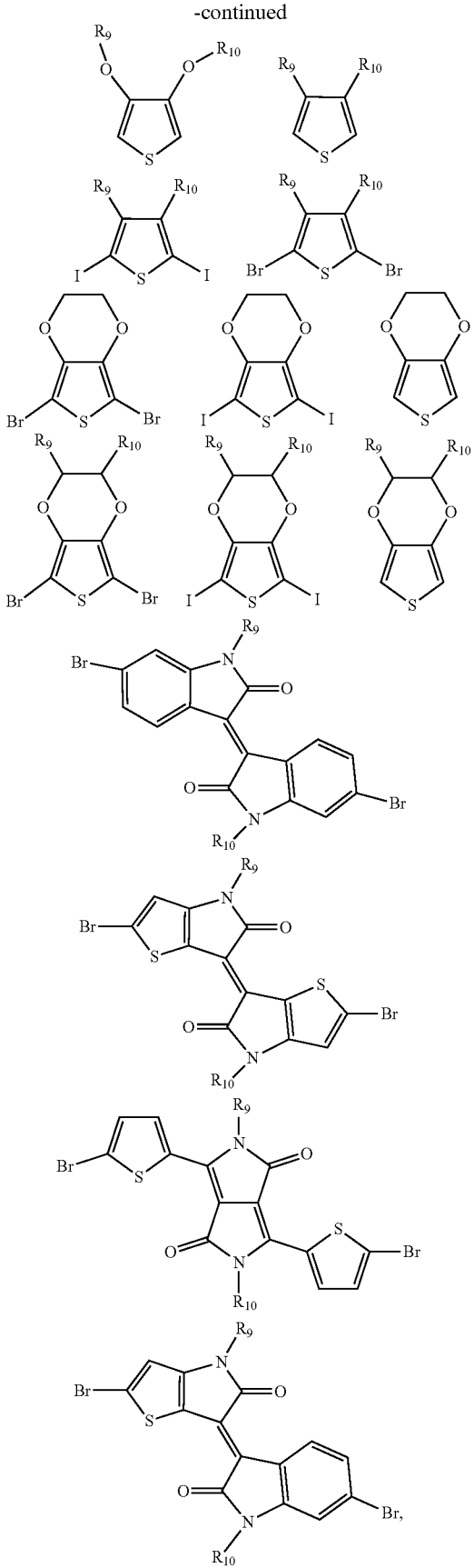

wherein each of $R_9$, $R_{10}$, $R_{11}$, and $R_{12}$ is independently a hydrocarbyl moiety with or without one or more functional groups, including, but not limited to, hydrogen, $C_1$-$C_{30}$ alkyl, $C_2$-$C_{30}$ alkenyl, $C_2$-$C_{30}$ alkynyl, $C_2$-$C_{30}$ alkylcarbonyl, $C_1$-$C_{30}$ alkoxy, $C_3$-$C_{30}$ alkoxyalkyl, $C_2$-$C_{30}$ alkoxycarbonyl, $C_4$-$C_{30}$ alkoxycarbonylalkyl, $C_1$-$C_{30}$ aminylcarbonyl, $C_1$I-$C_{30}$ aminylalkyl, $C_1$-$C_{30}$ alkylaminyl, $C_1$-$C_{30}$ alkylsulfonyl, $C_3$-$C_{30}$ alkylsulfonylalkyl, $C_6$-$C_{18}$ aryl, $C_3$-$C_{15}$ cycloalkyl, $C_3$-$C_{30}$ cycloalkylaminyl, $C_5$-$C_{30}$ cycloalkylalkylaminyl, $C_5$-$C_{30}$ cycloalkylalkyl, $C_5$-$C_{30}$ cycloalkylalkyloxy, $C_1$-$C_{12}$ heterocyclyl, $C_1$-$C_{12}$ heterocyclyloxy, $C_3$-$C_{30}$ heterocyclylalkyloxy, $C_1$-$C_{30}$ heterocyclylalkyloxy, $C_1$-$C_{30}$ heterocyclylaminyl, $C_5$-$C_{30}$ heterocyclylalkylaminyl, $C_2$-$C_{12}$ heterocyclylcarbonyl, $C_3$-$C_{30}$ heterocyclylalkyl, $C_1$-$C_{13}$ heteroaryl, or $C_3$-$C_{30}$ heteroarylalkyl.

Figure 4A:
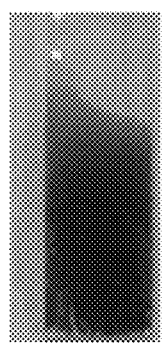
FIGS. 4(A)-(B) are the images of an example homopolymer thin film (FIG. 4(A)) and an example copolymer thin film (FIG. 4(B)) deposited on an ITO/glass.
Figure 4B:
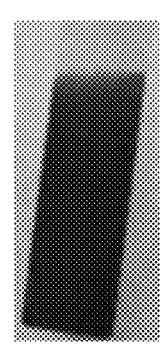

In some embodiments, the disclosed homopolymer or copolymer can be processed into thin films, as shown in FIGS. 4(A)-(B), by a manufacturing friendly spin-coating technique.

The method to synthesize the disclosed polymer comprises a polymerization reaction of the disclosed disulfide-containing monomers or with at least one other monomer. The polymerization reaction includes, but is not limited to, electrochemical polymerization, chemical polymerization, or acid-mediated chain-growth polymerization. Polymers comprising monomers of formula 1 can be directly synthesized via polymerization reactions. Polymers comprising monomers of formula 2 can be formed by reduction of disulfide group of polymers comprising monomers of formula 1. Polymers comprising monomers of formula 3 can be formed by thiol- or disulfide-related chemistry reactions from either the disulfide bond from polymers comprising monomers of formula 1, or thiol groups from polymers comprising monomers of formula 2.

A variety of thiol-related reactions can introduce various functionalities to the polymers based on the disclosed monomers. Each disulfide-containing monomer can introduce two functional side chains into the disclosed polymer. Compared to conventional monomers, which can only produce one side chain, two side chains benefit from a more hindrance effect, leading to a lower degree of polymer aggregation, thus creating greater electrochemical proprieties with balanced ion and electron mobilities of the polymer. The disulfide bond also serves as an excellent thiol protection method to avoid the thiol group's oxidation during polymer production.

Functionalization and modifications of the disclosed polymer can be achieved by a thiol or disulfide involving chemistry. The polymers made by at least one of the disclosed monomers can be further modified by any thiol or disulfide involving reactions to introduce various functionalities, such as adjusted interaction with solid substrates, tailored biological response, modified hydrophobicity, enhanced rigidity, solvent resistance, thermal stability, adhesive, etc. For example, the disclosed polymer can be modified with a long-chain alkyl group to increase the resulting polymer's hydrophobicity.

The disclosed polymer can also be crosslinked with at least one of the disclosed monomers to achieve improved properties, for example, a more stable and rigid polymer. Crosslinking can occur at the disulfide or thiol moieties on the side chains with or without a linker when polymerization happens at the ProDOT moiety. Because of the great nucleophilicity of sulfur, a much greater library of the linkers can be utilized to crosslink the disclosed polymer with fewer limitations on the reaction condition and therefore benefitting the polymer production and manufacture.

The disclosed monomer of formula 1, 2, or 3 may also be used as crosslinkers for other polymers. The amount of the disclosed monomer(s) relative to other monomers may be varied to yield polymers with different degrees of crosslinking.

The disclosed polymers also may be doped to modify their conductivity and other properties. The doping process is either for n-type or p-type, depending on the specific composition of the disclosed polymer.

The disclosed polymers can exhibit high electrical and great electrochromic properties, and/or the ease of side-chain modification for further functionalization and/or the possibility of crosslinking to increase stability. Therefore, the polymers of the present invention can be utilized in various devices, such as electrochromic devices, photovoltaic devices, batteries, diodes, capacitors, and organic and inorganic electroluminescent devices.

The following embodiments serve as examples of using the disclosed polymers in the electrochromic device.

Embodiments

Embodiment 1

Disulfide Containing Homopolymer (DS-Polymer 1) Synthesized by Electrochemical Polymerization In one embodiment, an electrochemical homopolymer DS-polymer 1 comprises a formula of

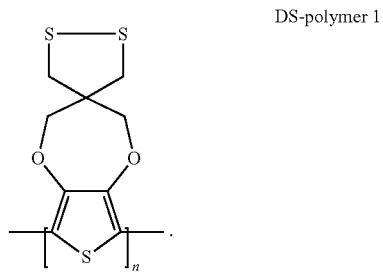

DS-polymer 1

Figure 5:
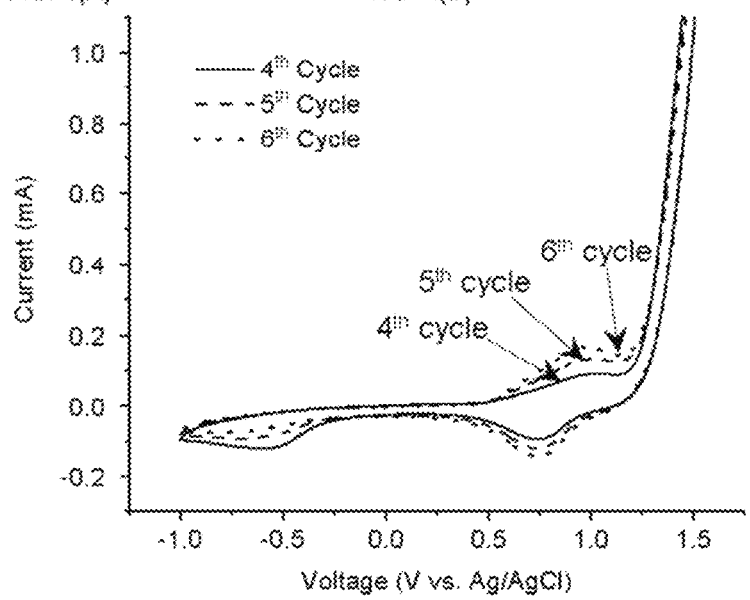
FIG. 5 is cyclic voltammogram (CV) data during an electropolymerization process of the DS-polymer 1 with different cycles.

DS-polymer 1 is a homopolymer synthesized by electrochemical polymerization with monomers of formula 1. Some degree of crosslinking may also be formed during the electropolymerization process. The monomers are dissolved in propyl carbonate (PC) solution with a concentration of 0.01M. Tetrabutylammonium hexafluorophosphate (TBAPHF) is used as a supporting electrolyte. The electropolymerization is carried out with an ITO substrate as the working electrode for the polymer deposition, a Pt mesh as the counter electrode, and Ag/AgCl as the reference electrode. The ITO substrate is washed with CHCl₃ and ethanol before use. Electropolymerization is used to synthesize DS-polymer 1 with a scan speed of 20 mv/s and the potential scanning window from −1V to 1.6V. DS-polymer 1 is electro synthesized and deposited at the ITO electrode surface in an aqueous medium. The cyclic voltammograms during 6 cycles of the electropolymerization for DS-polymer 1 are recorded. FIG. 5 illustrates the data for the $4^{th}$-$6^{th}$ cycles. In FIG. 5, the DS-polymer 1 polymerized by the monomer of formula 1 only has one oxidized peak, which corresponds to the oxidized monomer 1 moiety. The areas covered by the CV curves increase with the increased cycle numbers, indicating the continuous deposition of polymer on the ITO surface. Thus, the thickness of the disclosed polymer can be controlled by the cycle numbers.

Embodiment 2

Disulfide Containing Copolymer (DS-Polymer 2) Synthesized by Electrochemical Polymerization In one embodiment, an electrochemical copolymer DS-polymer 2 comprises a formula of

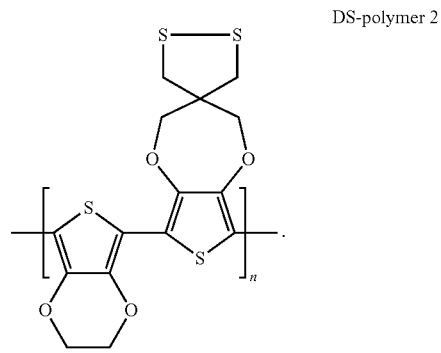

DS-polymer 2

Figure 6:
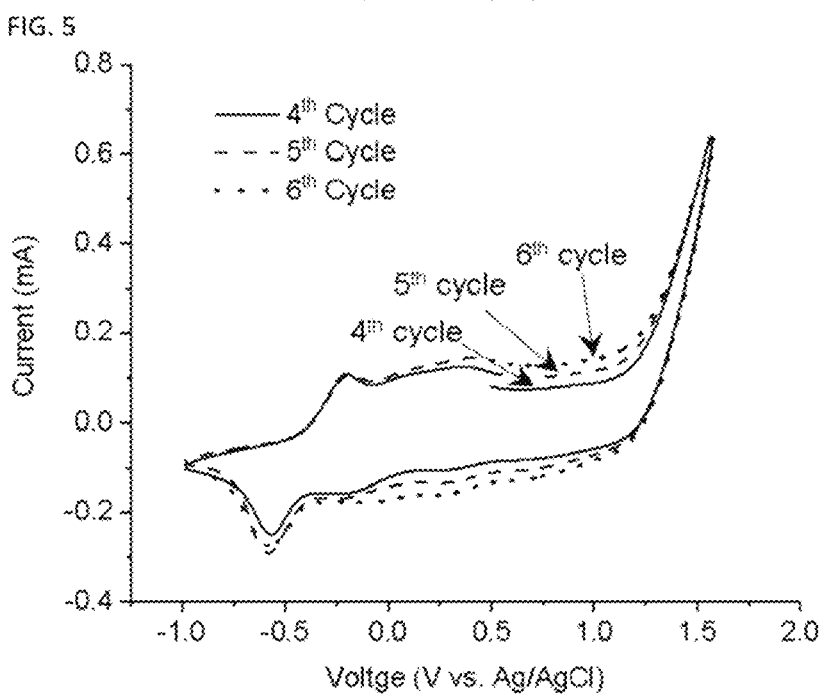
FIG. 6 is CV data during an electropolymerization process of the DS-polymer 2 with different cycles.

In one embodiment, an electrochemical copolymer DS-polymer 2 comprises a formula of DS-polymer 2 is a copolymer synthesized by electrochemical polymerization of 3,4-ethylenedioxythiophene (EDOT) monomer and monomer of formula 1. Some degree of crosslinking may also be formed during the electropolymerization process. The monomers are dissolved in propyl carbonate (PC) solution with a concentration of 0.01M. Tetrabutylammonium hexafluorophosphate (TBAPHF) is used as a supporting electrolyte. The electropolymerization is carried out with an ITO substrate as the working electrode for the polymer deposition, a Pt mesh as the counter electrode, and Ag/AgCl as the reference electrode. ITO substrate is washed with CHCl₃ and ethanol before use. Electropolymerization is used to synthesize DS-polymer 2 with a scan speed of 20 mv/s and the potential scanning window from −1V to 1.6V. DS-polymer 2 is electro synthesized and deposited at the ITO electrode surface in an aqueous medium. The cyclic voltammograms during 6 cycles of the electropolymerization for DS-polymer 2 are recorded. FIG. 6 illustrates the data for the $4^{th}$-$6^{th}$ cycles. In FIG. 6, the DS-polymer 2 polymerized by the monomer of formula 1 and EDOT has two oxidized peaks, which correspond to the oxidized monomer 1 moiety and oxidized EDOT moiety. The areas covered by the CV curves increase with the increased cycle numbers, indicating the continuous deposition of polymer on the ITO surface. Thus, the thickness of the disclosed polymer can be controlled by the cycle numbers.

Figure 7:
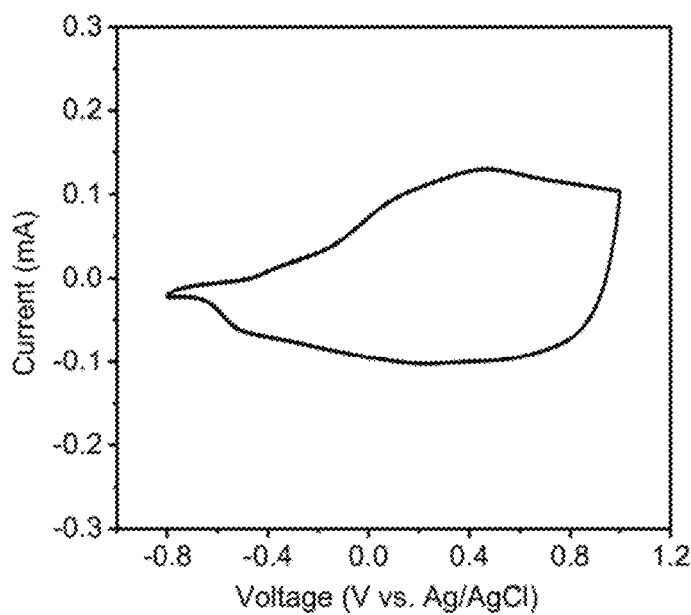
FIG. 7 is CV data of the DS-polymer 2.
Figure 8:
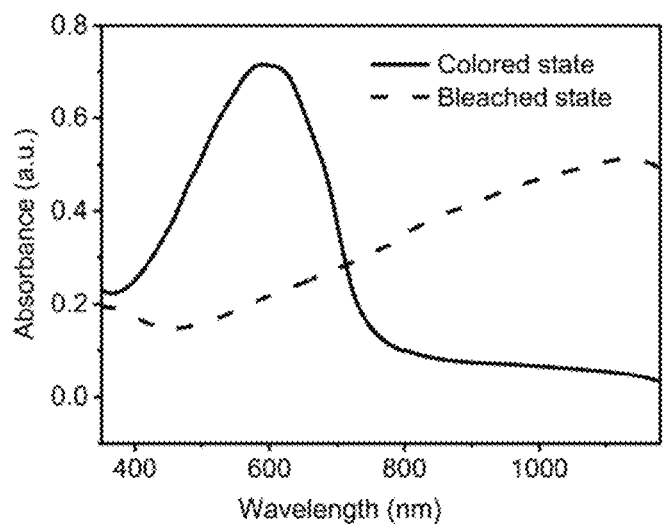
FIG. 8 shows UV-vis absorbance spectra of the DS-polymer 2.
Figure 9A:
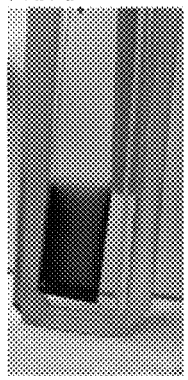
FIGS. 9(A)-(C) are images of a DS-polymer 2 thin film at a colored state (FIG. 9(A)), intermediate state (FIG. 9(B)), and bleached state (FIG. 9(C)).
Figure 9B:
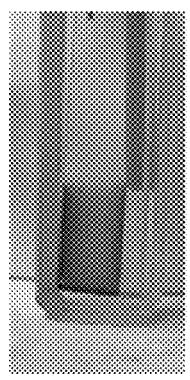
Figure 9C:
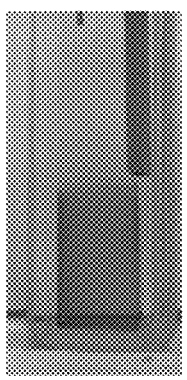

The electrochemical property of the DS-polymer 2 thin film is tested in a three-electrode configuration, with the DS-polymer 2 on ITO/glass as the working electrode, Ag/AgCl as the reference electrode, and Pt wire as the counter electrode. The example copolymer can work under different scan rates with the voltage window of −0.8 V to 1.0 V, as shown in FIG.7. The DS-polymer 2 thin film also shows great electrochromic properties within the voltage range of −0.8 V to 1.0V, as shown in FIG. 8 and FIGS. 9(A)-(B). As shown in FIG. 8, its UV-vis absorption dramatically decreases at visible light ranges (400-700 nm)

with increased applied working voltages. However, the opposite trend is observed at a longer wavelength (>700 nm). As shown in FIGS. 9(A)-(B), the DS-polymer 2 also shows distinct colors according to different applied working voltages. At −0.8 V, the example copolymer is in a colored state with a dark blue color (FIG. 9(A)). The maximal absorbance is around 597 nm. With the voltage increases, the color of the example copolymer is partially bleached out, displaying a light purple color at −0.2 V (FIG. 9(B)) and a highly transparent grey color at 1.0 V (FIG. 9(C)).

Embodiment 3

Disulfide Containing Copolymer (DS-Polymer 3) Synthesized by Acid-Mediated Chain-Growth Polymerization In one embodiment, an electrochemical copolymer DS-polymer 3 comprises a formula of

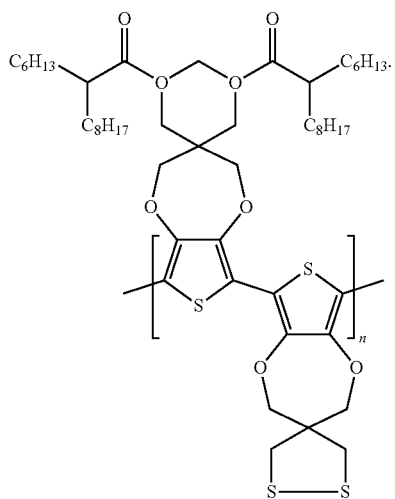

DS-polymer 3 is a copolymer synthesized by an ester derived ProDOT monomer and monomer of formula 1 via an acid-mediated chain-growth polymerization.

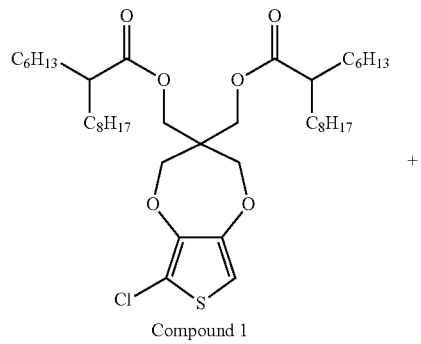

Compound 1

+

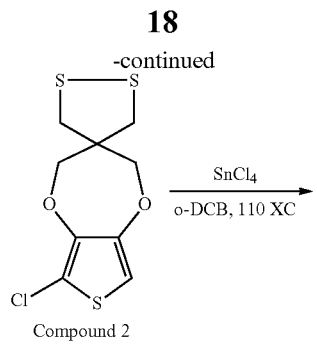

Compound 2

$\xrightarrow{\text{SnCl}_4}_{\text{o-DCB, 110 XC}}$

-continued

DS-polymer 3

Figure 10:
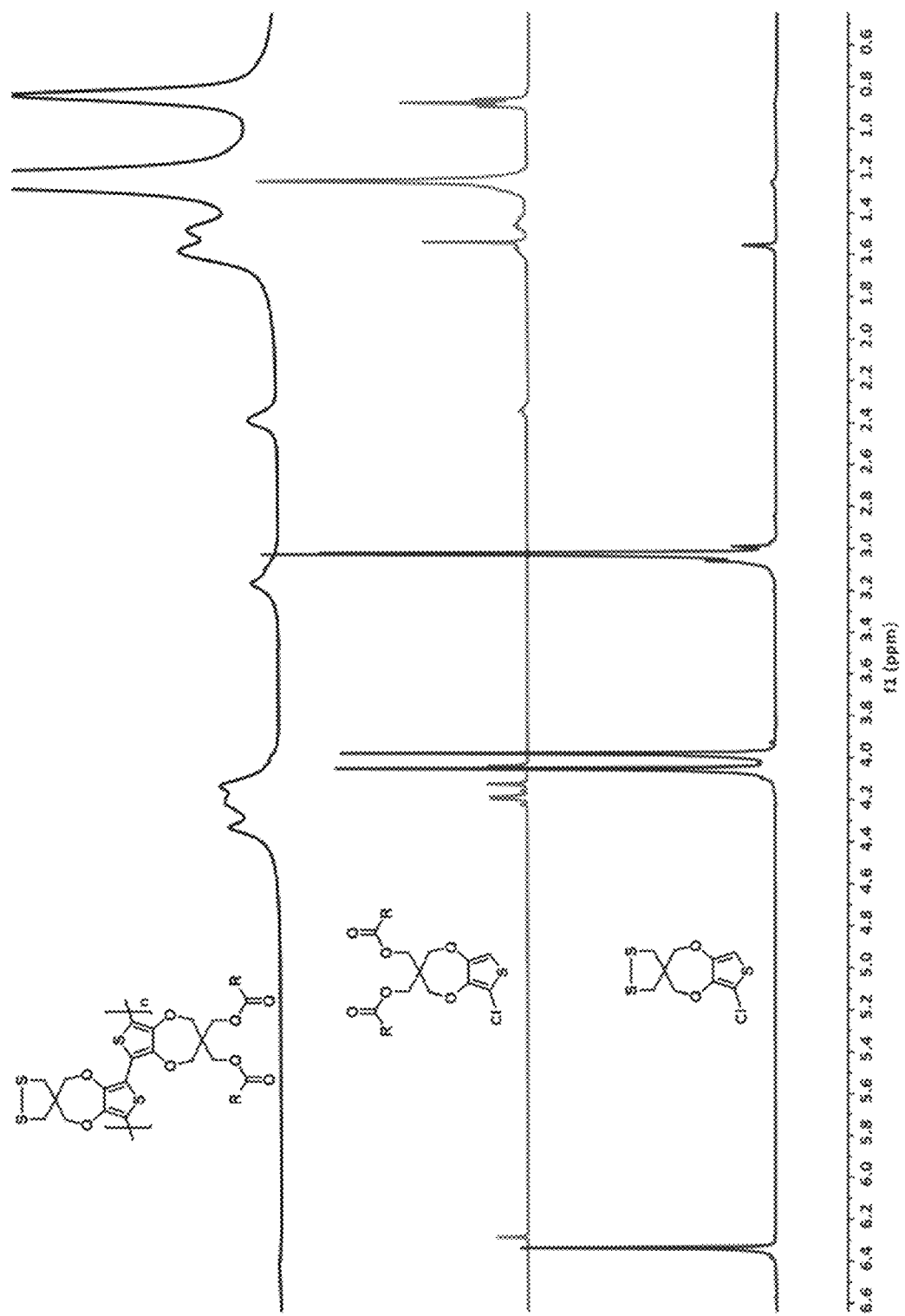
FIG. 10 is NMR data of the DS-polymer 3 and monomers.

Compound 1 (820.0 mg, 1.13 mmol, 1.0 eq) and compound 2 (316.5 mg, 1.13 mmol, 1.0 eq) are dissolved in anhydrous 1,2-dichlorobenzene (o-DCB) (15.0 mL) at 110° C. Then solution of SnCl$_4$ (58.7 mg, 225.42 mmol) in anhydrous o-DCB (2.25 mL) is added and stirred at 110° C. overnight to produce a reaction mixture. The reaction mixture is poured into MeOH (100 mL) and then a few drops (2-5) of hydrazine hydrate is added to neutralize/dedope the polymer. The mixture is stirred for 1-3 h to allow the precipitation of the product. The solid is filtered and washed with MeOH (200 mL) and hexanes (200 mL) and dried under vacuum. The yield is 72%. FIG. 10 shows the $^1$H NMR spectra of the resulting DS-polymer 3 product as well as the reaction monomers.

Figure 11:
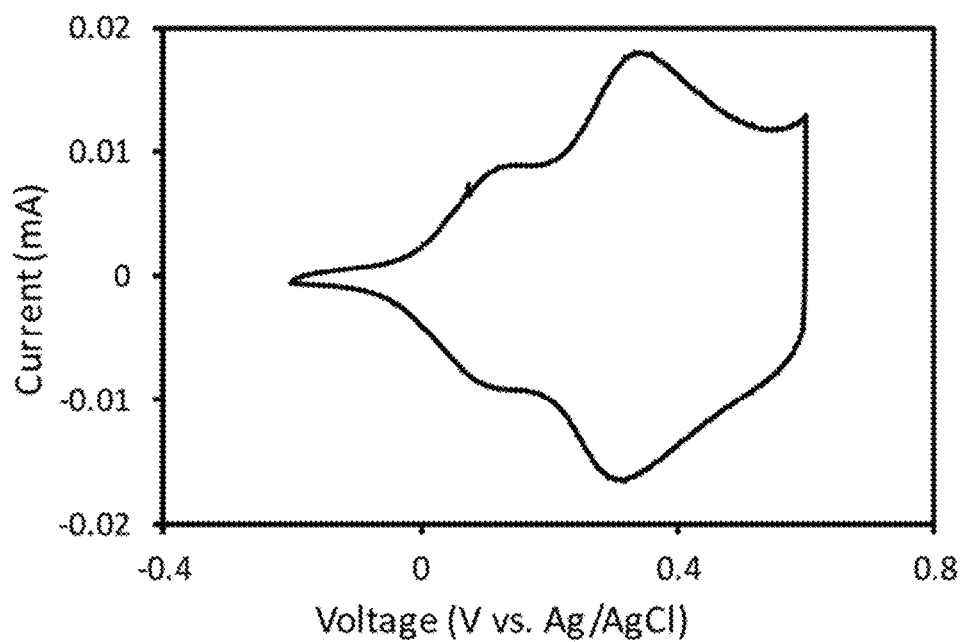
FIG. 11 is CV data of the DS-polymer 3.
Figure 12A:
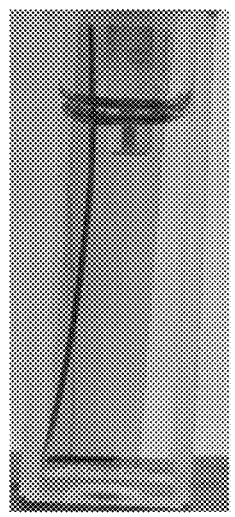
FIGS. 12(A)-(B) are images of a DS-polymer 3 thin film at a colored state (FIG. 12(A)) and bleached state (FIG. 12(B)).
Figure 12B:
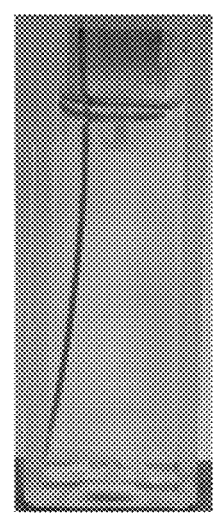
Figure 13:
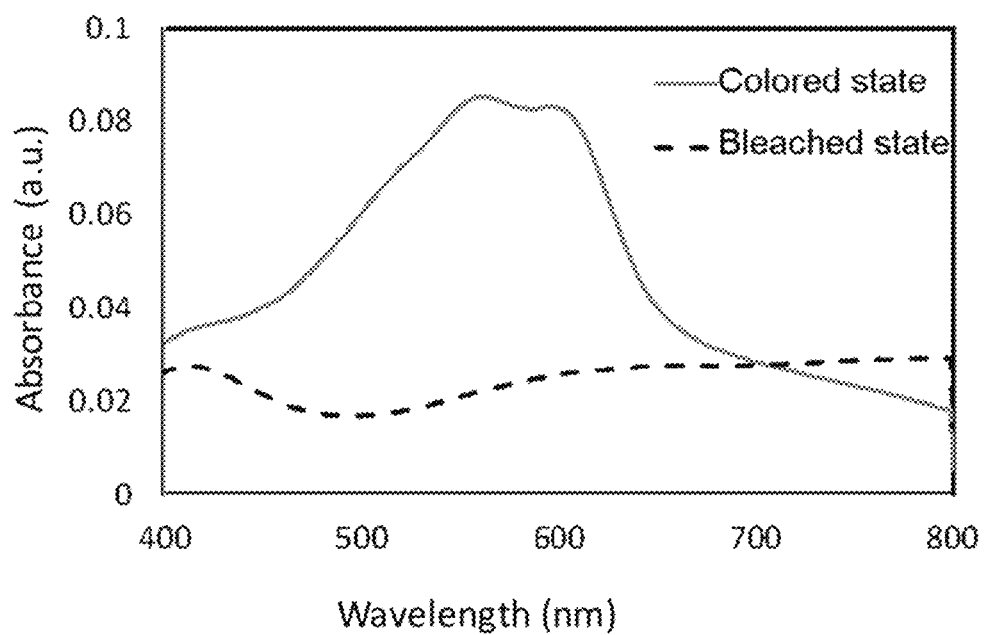
FIG. 13 shows UV-vis absorbance spectra of the DS-polymer 3 at colored and bleached states.
Figure 14:
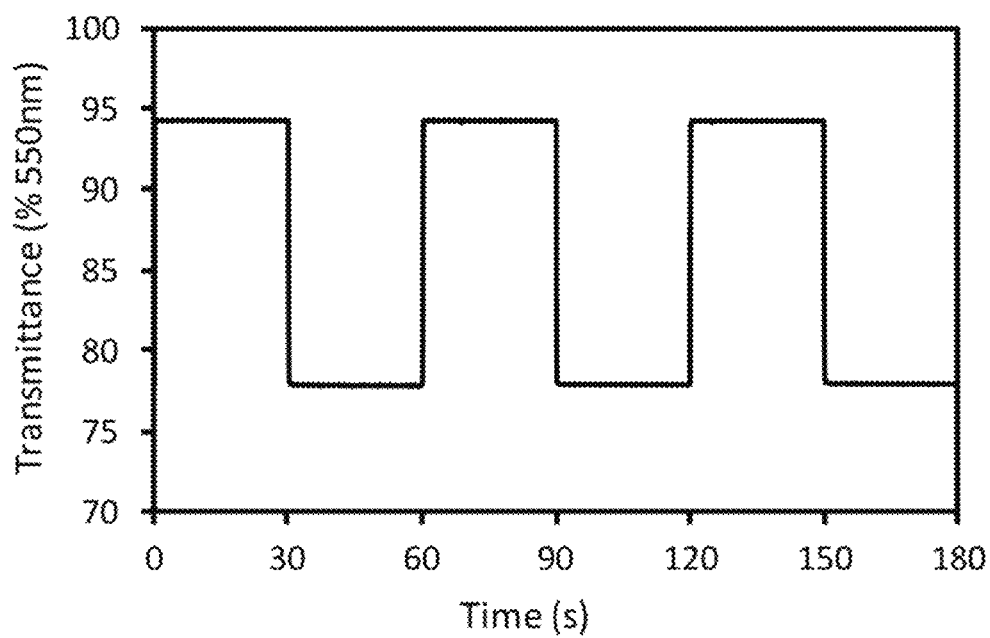
FIG. 14 shows the switching kinetics of the DS-polymer 3.

The DS-polymer 3 is dissolved in chloroform and deposited on ITO/glass substrate as a thin film and tested in a three-electrode configuration, with resulting DS-polymer 3 thin film as the working electrode, Ag/AgCl as the reference electrode, and Pt wire as the counter electrode. FIG. 11 shows the CV data of the polymer thin film between −0.3V to 0.6V. In FIGS. 12(A)-(B), the DS-polymer 3 thin film shows light purple color at a colored state (FIG. 12(A)), while highly transparent at a bleached state (FIG. 12(B)). The corresponding absorbance spectra of the DS-polymer 3 thin film at both states are shown in FIG. 13, the DS-polymer 3 thin film shows maximal absorbance at 562 nm at a colored state while nearly no absorbance at all wavelengths from 400 nm to 800 nm at a bleached state. The DS-polymer 3 thin film can switch steadily between 77% to 94% transmittance as shown in FIG. 14.

What is claimed is:

1. An electrochromic monomer comprising a disulfide-containing monomer of formula 1

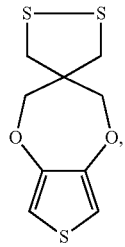

formula 1 or a derivative (formula 2) of the disulfide-containing monomer of formula 1,

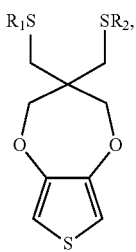

formula 2 wherein each of $R_1$ and $R_2$ is a hydrocarbyl moiety with or without one or more functional groups.

2. A polymer prepared by incorporating at least one monomer of the formula 1 or the formula 2 claim 1 into another monomer or a polymer.

3. A method for forming the disulfide-containing monomer of formula 1 of claim 1, comprising contacting a monomer of formula 4 with sulfur in a form of allotrope and a vulcanized reagent in the presence of a polar solvent,

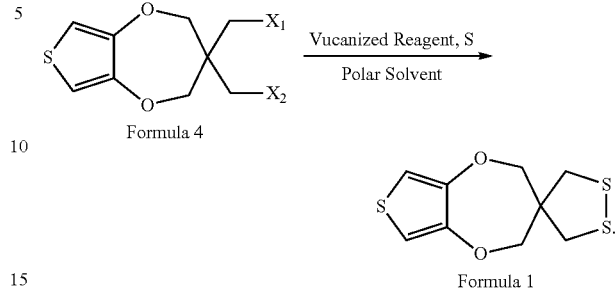

Formula 4

Formula 1 wherein,
each of $X_1$ and $X_2$ is a functional group that forms nucleophilic substitutional reactions at their position;
the vulcanized reagent is a sulfur-containing compound that participates in the nucleophilic substitution reaction; and
the polar solvent comprises one or more of chloroform, dichloromethane, nitromethane, acetonitrile, or toluene.

4. The method of claim 3, wherein each of $X_1$ and $X_2$ comprises one of Cl, Br, I, OH, or OTf.

5. The method of claim 3, wherein the vulcanized reagent comprises one of NaHS, KHS, $Na_2S$, $K_2S$, $Na_2S_2O_3$, $H_2S$, or $CS(NH_2)_2$.

6. A method for forming the disulfide-containing monomer of formula 2 of claim 1, comprising conducting a sulfide/thiol-involving reaction with the disulfide-containing monomer of formula 1.

7. An electrochromic device, comprising the polymer of claim 2.

* * * * *